Figure 1:
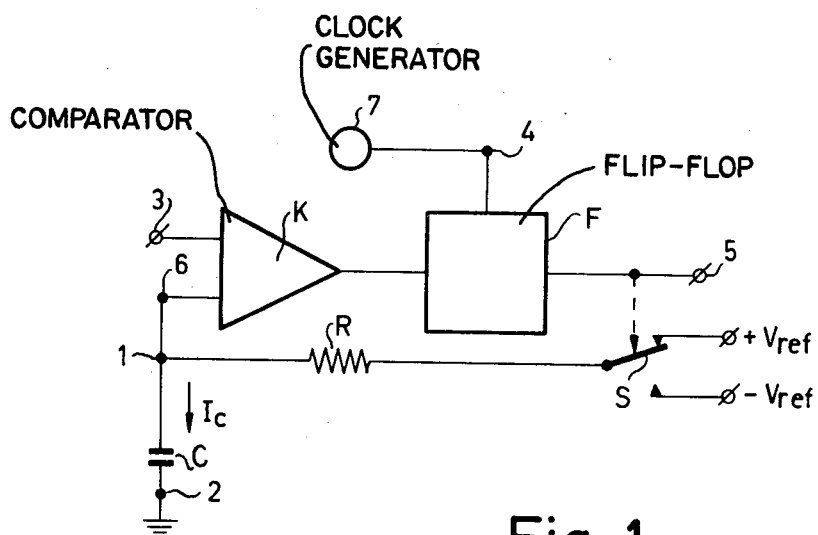

United States Patent [19]
Hoogendoorn et al.

[11] 4,057,796
[45] Nov. 8, 1977

[54] ANALOG-DIGITAL CONVERTER

[75] Inventors: Abraham Hoogendoorn; Robert Emile Johan van de Grift; Theodorus Jozef van Kessel, all of Eindhoven, Netherlands

[73] Assignee: U.S. Philips Corporation, New York, N.Y.

[21] Appl. No.: 628,595

[22] Filed: Nov. 4, 1975

Related U.S. Application Data

[63] Continuation of Ser. No. 582,310, May 30, 1975, abandoned.

[51] Int. Cl.² .............................................. H03K 13/02
[52] U.S. Cl. ...................... 340/347 AD; 340/347 NT; 307/260
[58] Field of Search ................. 340/347 AD, 347 NT; 307/260, 265; 328/181

[56] References Cited
U.S. PATENT DOCUMENTS

| | | | |
|---|---|---|---|
| 3,781,870 | 12/1973 | Cutsogeorge | 340/347 AD |
| 3,835,402 | 9/1974 | Kublick | 307/260 |
| 3,842,413 | 10/1974 | Lagarde | 340/347 AD |

*Primary Examiner*—Charles D. Miller
*Attorney, Agent, or Firm*—Frank R. Trifari; Daniel R. McGlynn

[57] ABSTRACT

An analog-digital converter in which a capacitor is charged or discharged by a reference current with the aid of transistor switches, a continuous current flows through the capacitor which is determined by an input difference voltage. One side of the capacitor is connected via a comparator to a flip-flop, to which flip-flop a clock signal is applied and which flip-flop drives the transistor switches. The other side of the capacitor is connected to the first input of a differential amplifier, which differential amplifier forms part of a negative feedback loop which maintains the voltage at the first input of the differential amplifier equal to the voltage which is applied to the second input of the differential amplifier.

14 Claims, 8 Drawing Figures

ANALOG-DIGITAL CONVERTER

This is a continuation, of application Ser. No. 582,310, filed May 30, 1975, now abandoned.

The invention relates to an analog-digital converter which comprises a capacitor with a first and a second electrode, the voltage at the first electrode being applied to the input of a comparator, which comparator has a reference input to which a reference voltage is applied, and an output which is connected to a flip-flop, to which also a clock signal is applied and which, synchronized by said clock signal, controls a first transistor switch, which first transistor switch is connected to the first electrode of the capacitor, so that depending on the position of the transistor switch a charging or discharging current is fed through the capacitor, the output signal of the flip-flop being a digitized form of an input signal, which input signal is converted by a voltage-current converter into a continuous current which flows through the capacitor.

In the article "Integrating digital volt-meter: operating principles and accuracy" by P. A. Neeteson, published in "Electronic Applications Bulletin" No. 1, 1972, pages 37-58, an analog-digital converter is described in which a first electrode of a capacitor is connected to a first input of a comparator whose output is connected to a flip-flop, to which a clock signal is applied. The output signal of the flip-flop controls a switch of which one side is connected to the first electrode of the capacitor via a resistor. Furthermore, the known converter is characterized in that, depending on the position, the other side of the switch is connected to a positive or negative reference voltage source, while the second electrode of the capacitor is connected to a point of fixed potential, specifically earth potential, and the input signal is applied to the reference input of the comparator.

The known converter has the drawback that the capacitor is earthed at one side, so that the converter is less suited for the conversion of input difference signals. Moreover, the reference voltage sources present problems when of the converter is to be used in an integrated circuit.

The last-mentioned drawback can be eliminated applying Thevenin's theorem, which states that a voltage source with a series resistance may be replaced by a current source with a parallel-connected resistance, by converting the reference volage sources into reference current sources, said resistance being connected parallel to the capacitor. For very accurate converters it is more or less a drawback that two reference current sources are required.

It is an object of the invention to provide an analog-digital converter, which is suited for the conversion of input difference signals and which can take the form of an integrated circuit, while embodiments with only one reference current source are possible.

For this, the invention is characterized in that the voltage at the second electrode of the capacitor is applied to a first input of a differential amplifier, whose output signal is fed to the input of a transistor which is connected at as a current source, which transistor is included in the common circuit of the first and a second transistor switch, which second transistor switch is connected to the second electrode of the capacitor and which switch is also driven, though in phase opposition to the first transistor switch, by the output signal of the flip-flop, whilst to a second input of the differential amplifier a drive voltage is applied, so that as a result of the negative-feedback loop which is formed by the differential amplifier and the transistor which is connected as a current source, the voltage at the second electrode of the capacitor is maintained equal to said drive voltage, and that the first electrode of the capacitor via the main current path of a first transistor and the second electrode of the capacitor via the main current path of a second transistor are connected to a reference current source circuit, while the input signal is applied as a difference signal, either between the reference input of the comparator and the second input of the differential amplifier, or between the control inputs of the first and the second transistor.

At first sight the steps according to the invention seem to bear some resemblance to what is known from the published Netherlands Patent Application No. 7,007,870. Said Application also describes the floating connection of a capacitor between the input of a comparator and the input of a differential amplifier, whose output signal drives a transistor which is connected as a current source. However, this concerns a triangular-voltage generator which, in addition to functional differences, also exhibits differences in respect of circuit design with respect to the converter according to the invention, in that no clock signal is provided, an input signal is absent the negative-feedback loop with the differential amplifier and the transistor which is connected as a current source does not maintain the second electrode (point 2 of FIG. 2 of the relevant Application) at a specific voltage, but realizes a constant ratio of the voltages at the two electrodes of the capacitor, and in that in said triangular voltage generator the function of the comparator with the flip-flop of the converter according to the invention is performed by a multivibrator, which is driven by the voltage at the first electrode of the capacitor.

Figure 2:
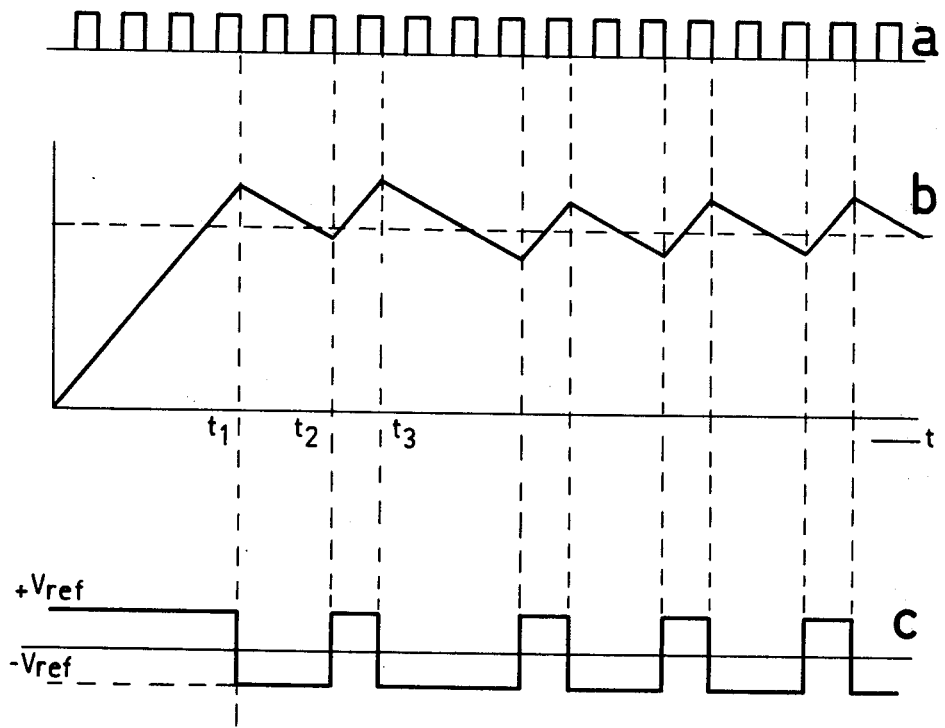
Figure 3:
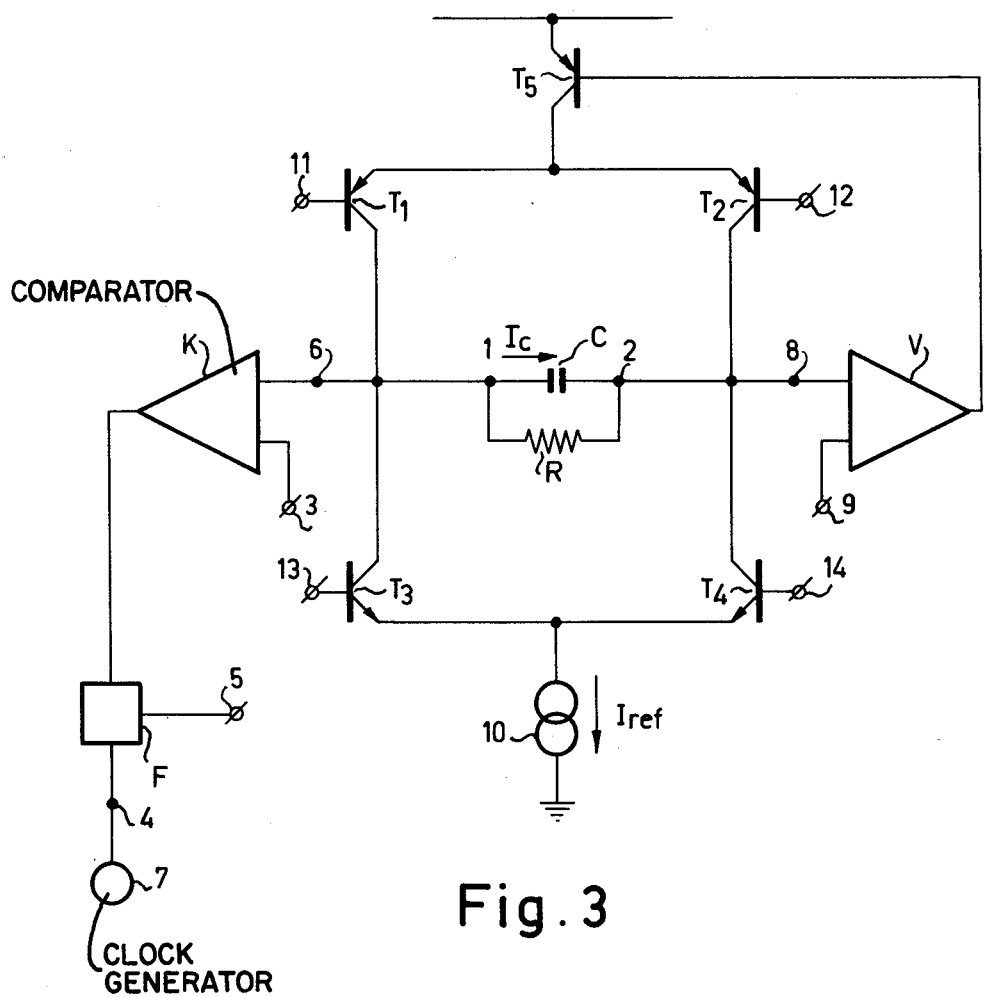
Figure 4:
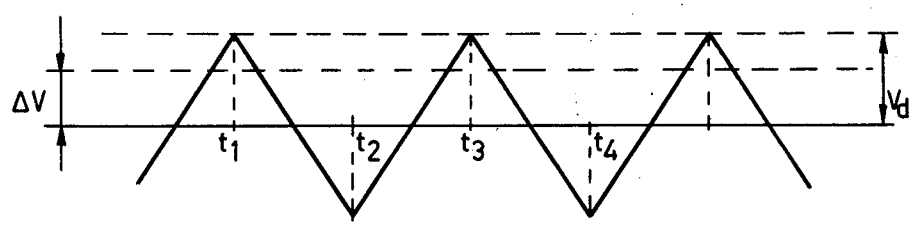
Figure 5:
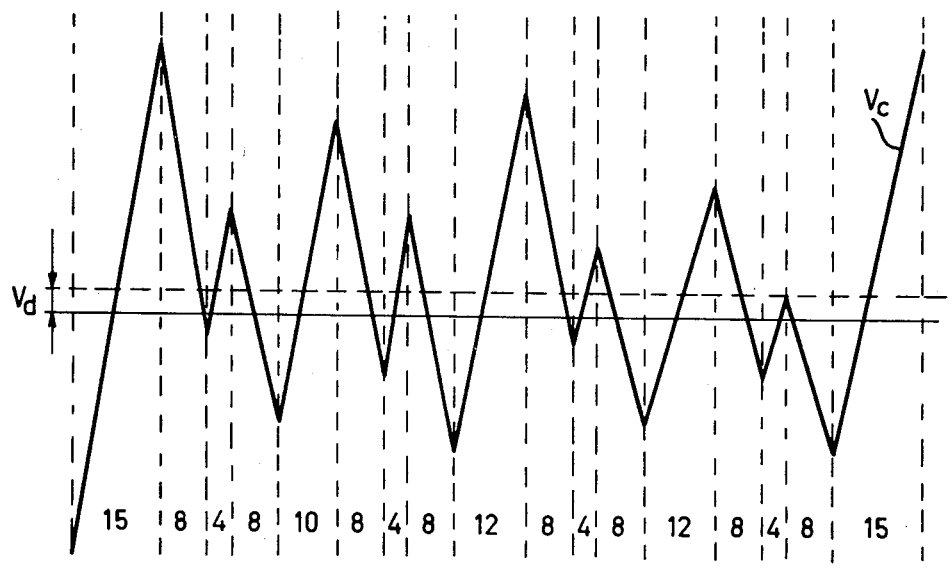
Figure 6:
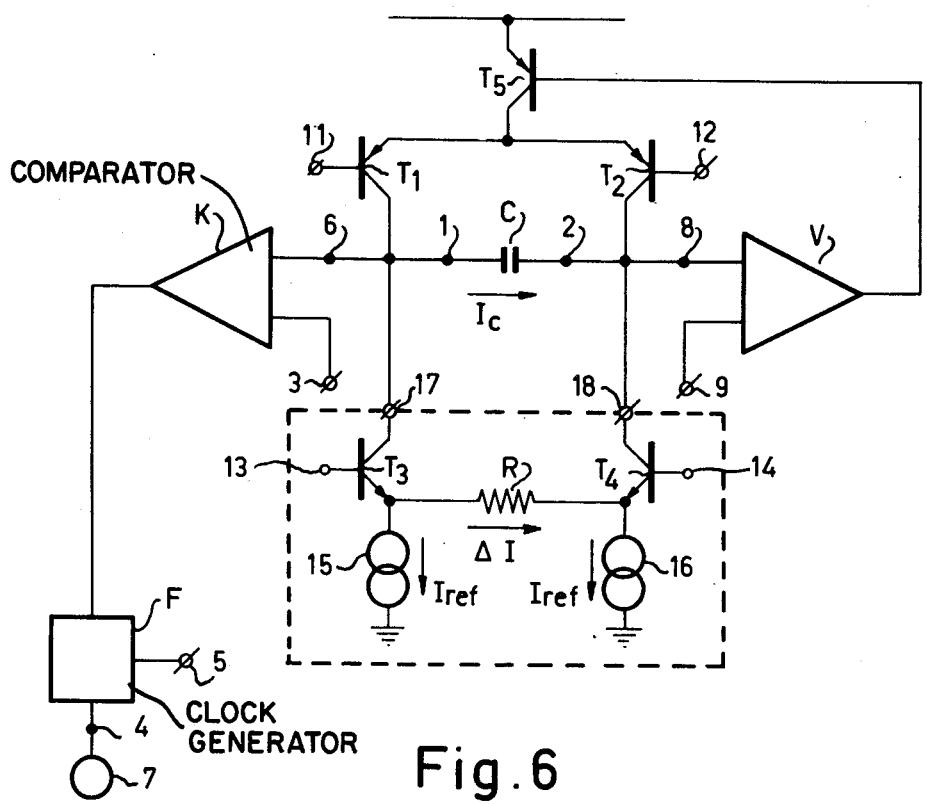
Figure 7:
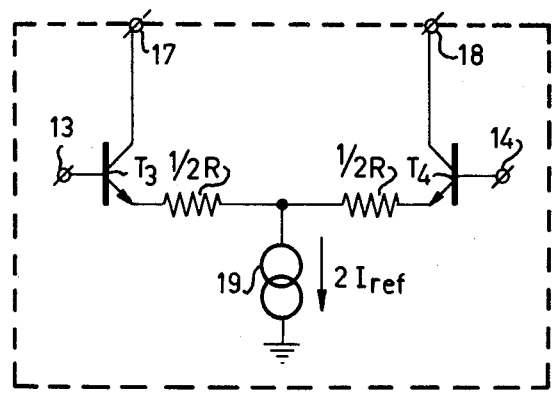
Figure 8:
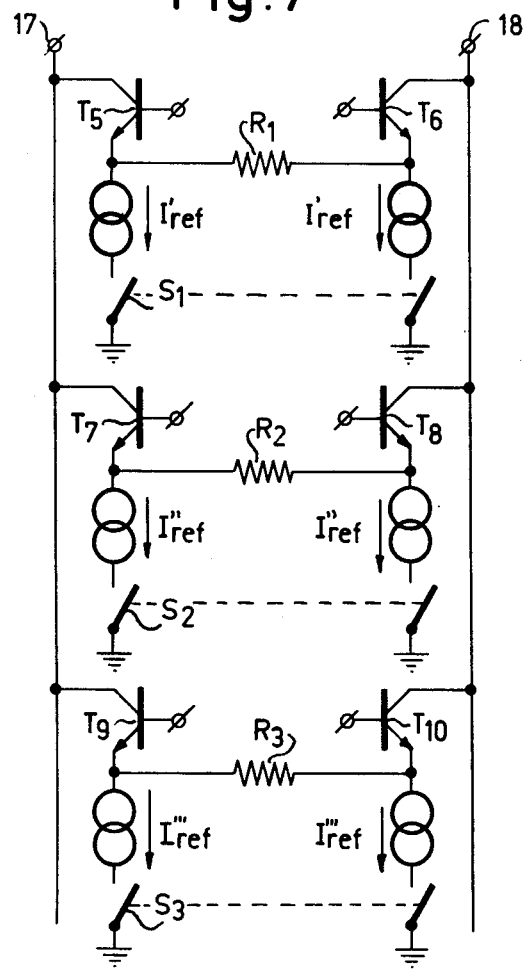

The invention will be described in more detail with reference to the Figures, in which FIG. 1 shows the analog-digital converter known from the cited publication, FIG. 2 shows some voltage waveforms associated with the converter of FIG. 1, FIG. 3 shows a first embodiment of an analog digital converter according to the invention, FIG. 4 represents the variation of the voltage across the capacitor in the absence of an input signal, FIG. 5 represents the variation of the voltage across the capacitor in the absence of an input signal, while the time interval between the switching instants is varied, FIG. 6 shows a second embodiment of an analog-digital converter according to the invention, FIG. 7 shows a modified part of the converter of FIG. 6, and FIG. 8 shows an embodiment of a modified part of the converter of FIG. 6 for the purpose of sensitivity adjustment.

FIG. 1 shows the analog-digital converter known from the cited publication. The capacitor C is conncted by its first electrode 1 to the input 6 of the comparator K and via a resistor R to the switch S, which in the present case is symbolically represented but which in reality may be a more complex transistor circuit. The second electrode 2 of the capacitor C is connected to a point of fixed potential, in the present example earth potential. An input voltage $V_i$ is applied to the reference input 3 of the comparator K, whose output is connected to the flip-flop F. Said flip-flop comprises an additional input 4, to which a clock signal obtained from the clock generator 7 is applied. The output 5 of the flip-flop F controls the switch S, which is symbolically represented by the dashed arrow. Depending on its position the switch S is either connected to a positive reference voltage source $+V_{ref}$ or to a negative reference voltage source $-V_{ref}$. The switch S is controlled so that when the voltage $V_c$ across the capacitor is lower than the input voltage $V_i$, the voltage source $+V_{ref}$ is connected to the capacitor C and when the voltage $V_c$ is higher than the input voltage $V_i$, the voltage source $-V_{ref}$ is connected to the capacitor C. Controlling is effected with the aid of the output signal of the flip-flop. Said output signal has two voltage levels. The level changes only if the output signal of the comparator K changes owing to the capacitor being charged or discharged, and a clock pulse is present. The clock signal then has a synchronizing function. The state of the flip-flop changes for example upon the negative edge of the clock pulse.

When the capacitor C is connected to the positive reference voltage source, a current $I_c$ will flow through the capacitor C:

$$I_c = \frac{V_{ref}}{R} - \frac{V_c}{R} \qquad (1)$$

and when the capacitor C is connected to the negative reference voltage source:

$$I_c = -\frac{V_{ref}}{R} - \frac{V_c}{R} \qquad (2)$$

Consequently, depending on the position of the switch S, a charging or discharging current will flow through the capacitor C which equals $$\frac{V_{ref}}{R},$$

while independently of the switch position a discharging current $$\frac{V_c}{R}$$

will flow. When the voltage across the capacitor C is initially zero and an input voltage $V_i$ is applied, the capacitor C will be charged until $V_c$ has exceeded the input voltage $V_i$. Upon the next clock pulse the position of the switch S changes and the capacitor C discharges until $V_c$ has become smaller than the input voltage $V_i$, so that upon the next clock pulse the position of the switch S will change again. When the input voltage is sufficiently high the voltage across the capacitor C will approximately equal the input voltage $V_i$, so that in expressions (1) and (2) $V_i$ may be substituted for $V_c$. The slope of the charging curve is then:

$$\frac{V_{ref} - V_i}{RC} \qquad (3)$$

and the slope of the discharging curve:

$$\frac{V_{ref} + V_i}{RC} \qquad (4)$$

As the ratio between the slope of the charging and the discharging curve is determined by the input voltage, the switching function is a measure of the input voltage.

FIG. 2 shows the variation of the various voltages, FIG. 2a representing the clock signal, FIG. 2b the voltage across the capacitor, and FIG. 2c the voltage which appears at the switch S. When the input voltage is applied, the capacitor voltage increases until at the instant $t_1$ the position of switch S changes, and the capacitor voltage decreases, until $(V_c - V_i)$ is negative upon the occurrence of the clock pulse at instant $t_2$. The position of the switch S than changes again and the capacitor C is charged. The switching pattern of FIG. 2c is then a digitized form of the input signal, i.e. the input signal can be recovered from said signal. As the switch S is conrolled by the output signal of the flip-flop F, said output signal is preferably selected as output signal of the analog-digital converter. It will be evident that at decreasing input voltages the ratio between the time that the switch S is in the one position and the time that the switch S is in the other position will approximate to one, because the slopes of the charging and the discharging curve will become equal to each other owing to the decreasing current $V_c/R$, which approximately equals $V_i/R$, so that the input voltage $V_i$ is converted into a continuous discharging current. By replacing the reference voltage sources in accordance with Thevenin's therorem by reference current sources with currents of $\pm$ $$\frac{I_{ref}}{R}$$

and by conncting the resistor R in parallel with the capacitor C, charging and discharging currents will be obtained in accordance with the expressions (1) and (2).

As previously stated, the converter according to the invention has some advantages with respect to the known converter.

FIG. 3 shows a first embodiment of an analog-digital converter according to the invention. The capacitor C is shunted by the resistor R. The first electrode 1 of the capacitor C is connected to the input 6 of the comparator K and to the collectors of the switching transistors $T_1$ and $T_3$. The second electrode 2 of the capacitor C is connected to the input 8 of a differential amplifier V and to the collectors of the switching transistors $T_2$ and $T_4$. The output of the comparator K is connected to the flip-flop F, to which the clock generator 7 is also connected. The output 5 of the flip-flop F drives the inputs 11, 12, 13 and 14 of the switching transistors $T_1$, $T_2$, $T_3$ and $T_4$ in such a way that either transistor $T_1$ and $T_4$, or transistor $T_2$ and $T_3$ are in the conductive state. The output of the differential amplifier V is connected to the base of a transistor $T_5$, which is connected as a current source, whose collector is connected to the emitters of the transistors $T_1$ and $T_2$, while the common-emitter circuit of the transistors $T_3$ and $T_4$ includes the reference current source 10. The input voltage $V_i + \Delta V$ is applied to the reference input 3 of the comparator K and the input voltage $V_i$ to the input 9 of the differential amplifier V, so that the input difference voltage $\Delta V$ is available between the two inputs.

Owing to the negative feedback by means of the differential amplifier V and the transistor $T_5$, which is connected as a current source, the input 8 of the differential amplifier V is kept at the same voltage as the input 9, i.e. a voltage $V_i$ is available at the second electrode 2 of the capacitor C. The voltage at the first electrode 1 of the capacitor C, as in the case of the converter of FIG. 1, will approximately equal $V_i + \Delta V$ provided that $\Delta V$ is sufficiently high. If the transistors $T_1$ and $T_4$ are conductive, the current $I_c$ equals:

$$I_c = I_{ref} - \frac{\Delta V}{R} \tag{5}$$

and when the transistors $T_2$ and $T_4$ are conductive:

$$I_c = -I_{ref} - \frac{\Delta V}{R} \tag{6}$$

which expressions are similar to (1) and (2) after the following substitution:

$$I_{ref} = \frac{V_{ref}}{R} \text{ and } \Delta V = V_i$$

As a result, a charging or discharging current of a magnitude $I_{ref}$ will flow through the capacitor C, while a current $\Delta V/R$ will flow through the capacitor C, independently of the drive of the switching transistors. The input difference voltage $\Delta V$ is converted into a continuous current which flows through the capacitor C, so that a voltage-current converter is obtained which is constituted by the resistor R. Except for the control of the currents through the capacitor C, the operation of the analog-digital converter is identical to the operation of the converter of FIG. 1. In determining the expressions (5) and (6) the base currents of the switching transistors $T_3$ and $T_4$ have been neglected. For accurate converters the input currents of the input 6 of the comparator K and the input 8 of the differential amplifier V may be selected to equal the base currents of the transistors $T_3$ and $T_4$, so that the charging and discharging currents exactly equal $I_{ref}$.

Said input currents are determined by the quiescent current settings of the input transistors of the relevant circuits. When said input transistors are identical to the transistors $T_3$ and $T_4$ the quiescent current through said input transistors should equal $I_{ref}$.

Both with the converter of FIG. 1 and with the converter of FIG. 3 it has been assumed that the input voltage and input difference voltage respectively are sufficiently high. It will be demonstrated with reference to FIG. 4 that the converter has a threshold voltage for low input difference voltages.

FIG. 4 represents the variation of the voltage across the capacitor C when the input difference voltge $\Delta V$ is zero. The slopes of the charging and discharging curves are then the same. When the input difference voltage increases to the level indicated in the Figure, the switching function will not change, because at the decision instants $t_1, t_2, t_3 \ldots$ the comparator output signal is unchanged. The switching function will not differ from the switching function in the case of an input difference voltage $\Delta V$ which equals zero, until the input difference voltage $\Delta V$ exceeds the voltage $V_d$ indicated in the Figure.

In order to reduce the threshold volage $V_d$, the frequency of the clock signal may be increased, or the reference current $I_{ref}$ may be reduced. Both steps may present problems in respect of the dimensioning of the analog-digital converter. A first method to increase the sensitivity of the converter is to add an auxiliary signal to the input difference voltage, for example in the comparator. The amplitude ratio of said auxiliary signal should be known, and should be such that the average value is zero and that the signal, when it is a squarewave signal, comprises an equal number of different amplitude levels between zero and the threshold voltage $V_d$ and, in the case that it is a continuous function, the maximum amplitude at least equals $V_d$. At an incrasing input difference voltage $\Delta V$ the sum of the input difference voltage and the auxiliary signal will exceed the threshold voltage $V_d$ during an increasing number of the decision instants $t_1, t_3 \ldots$, so that the sensitivity of the converter has increased without causing measuring errors, because the auxiliary signal averages zero. As auxiliary signal it is for example possible to select noise or a quasi-stochastic signal. A second method is to vary the decision instants $t_1, t_2 \ldots$ in accordance with a pattern for which the distribution of the time intervals between the decision instants is known. This may iner alia be effected by modulating the frequency of the clock signal with noise or a quasi-stochastic function.

FIG. 5 shows the variation of the voltage across the capacitor C in the case that the decision pattern varies in time. The relative time spacing of the decision instants is plotted on the time axis of the Figure.

The recognition that the threshold voltage is caused by the act that the continuous current through the capacitor C is not directly determined by the input difference voltage, but by the instantaneous voltage across the capacitor, which only at comparatively high input difference voltages is approximately equal to the input difference voltage, leads to the second embodiment of a converter according to the invention, which is shown in FIG. 6 and in which the input difference voltage is directly converted into a continuous current through the capacitor C. The converter of FIG. 6 is identical to the converter of FIG. 3, except for the resistor R, the transistors $T_3$ and $T_4$, and the reference current source 10. The remaining part of the converter of FIG. 6 is designated by the same reference numeral as in FIG. 3. The electrodes 1 and 2 of the capacitor C are connected via the connection points 17 and 18 to a combined reference-current source and input circuit, which circuit is indicated by a dashed line in the Figure. Connection point 17 is connected to the collector of transistor $T_3$ and connection point 18 to the collector of transistor $T_4$. The input difference voltage $\Delta V$ is applied between the bases 13 and 14 of said transistors. The emitters of said transistors are interconnected via the resister R, while the emitter of transistor $T_3$ is connected to a current source 15, which carries a current of a magnitude $I_{ref}$ and the emitter of transistor $T_4$ is connected to an identical current source 16. The inputs 3 and 9 of the comparator K and the differential amplifier V respectively are connected to a point of fixed voltage, preferably a positive voltage.

If switching transistor $T_1$ is in the conducting state and switching transistor $T_2$ is in the non-conducting state, the current $I_c$ which flows through the capacitor C equals:

$$I_c = I_{ref} - \Delta I \tag{7}$$

$\Delta I$ being the current which flows through the resistor R, When switching transistor $T_1$ is in the nonconducting state and switching transistor $T_2$ is in the conducting state, the current $I_c$ which flows through the capacitor C equals:

$$I_c = -I_{ref} - \Delta I \tag{8}$$

If the current $\Delta I$ is small relative to the reference current $I_{ref}$, it follows that $\Delta I = \Delta V/R$. As a result the expressions (7) and (8) will become equal to the expressions (5) and (6), however, the continuous current $\Delta V/R$ is then directly determined by the input difference voltage, so that said threshold voltage does not occur. The voltage-current converter in this embodiment is consequently obtained in that the resistor R is included between the emitters of the transistors $T_3$ and $T_4$.

The two current sources 15 and 16 may simply be realized through integrated technology by the use of a "lateral" transistor with two identical collectors. However, if only one reference current source is desired, the part of the converter indicated by a dashed line in FIG. 6 may be replaced by means of a simple conversion by the circuit of FIG. 7, of which the connection points 17 and 18 should be connected to the electrodes 1 and 2 of the capacitor C.

The circuit of FIG. 7 is identical to the corresponding part of the analog-digital converter of FIG. 6, except for the resistor R and the current sources 16 and 17. The resistor R in the circuit of FIG. 7 has a centre tap, which is connected to a current source 19. The current source 19 carries a current $2I_{ref}$. Viewed from the connection points 17 and 18 said circuit is identical to the corresponding part of the analog-digital converter of FIG. 6.

The combined current source and input circuit, represented by the part of FIG. 6 which is enclosed by a dashed line, allows the sensitivity of the analog-digital converter to be changed in a simple manner.

FIG. 8 shows an embodiment of the relevant part of the analog-digital converter of FIG. 6, in which the input sensitivity can be changed. Between the connection points 17 and 18 the circuit includes a number of combined current-source and input circuits, equal to the desired number of adjusting facilities, in accordance with the relevant part of the converter of FIG. 6 which is surrounded by a dashed line. In the three combined current-source and input circuits shown the resistor R has been replaced by the resistors $R_1$, $R_2$ and $R_3$, while the reference current sources in the three circuits shown carry the currents $I'_{ref}$, $I''_{ref}$ and $I'''_{ref}$. The double switches $S_1$, $S_2$ and $S_3$ which are included in the current-source circuits symbolically indicate that at option one of the circuits can be switched on. The sensitivity of the analog-digital converter is determined by the resistor and the current sources of the switched-on section.

By the use of current sources and because the circuit includes only one resistor, the converter is suited to be realized in integrated circuit form. If desired, the capacitor C and the resistor R may be externally fitted.

It is obvious that the scope of the invention is neither limited to the embodiments described, nor to the transistor types shown in the Figures.

What is claimed is:

1. An analog-to-digital converter for converting an input analog signal comprising
   a comparator having first and second inputs and an output;
   a differential amplifier having first and second inputs and an output;
   a capacitor having a first electrode connected to said first input of said comparator, and a second electrode to said first input of said differential amplifier;
   a flip-flop, having an input connected to the output of said comparator, and an output representing the digitized form of said input analog signal;
   means connected to the output of said differential amplifier for controlling the current through said capacitor;
   a clock generator, for applying a clock signal to said flip-flop;
   a first transistor switch controlled by said flip-flop and connected to said first electrode of said capacitor; and
   a second transistor switch connected to the second electrode of said capacitor and driven in phase opposition to said fist transistor switch by the output signal of said flip-flop.

2. An analog-digital converter as claimed in claim 1, wherein in that the input difference signal is applied between the reference input of the comparator and the second input of the differential amplifier, that the voltage-current converter is constituted by a resistor which shunts the capacitor, that the first and the second transistor are switching transistors which are driven by the output signal of the flip-flop, the first transistor being driven resistor.

3. An analog-digital converter as claimed in claim 2, wherein the converter includes means for adding an auxiliary signal to the input signal, which auxiliary signal being at least a quasi-stochastic signal.

4. An analog-digital converter as claimed in claim 2, characterized in that the frequency of the clock signal is modulated with a noise signal or at least a quasi-stochastic signal.

5. An analog-digital converter as defined in claim 1, wherein said means connected to the output of said differential amplifier comprises a transistor connected at a current source, included in the common circuit of said first and second transistor switches.

6. An analog-digital converter as defined in claim 5, further comprising means connected to the second input of said differential amplifier for providing a drive voltage for forming a negative feed back loop by the differential amplifier and said transistor connected as a current source.

7. An analog-digital converter as defined in claim 6, wherein the voltage at the second electrode of the capacitor is maintained equal to said drive voltage, and the first electrode of the capacitor, by means of the main current path of a first transistor, and the second electrode of the capacitor, by means of the main current path of a second transistor, are connected to a reference current-source circuit, the input signal being applied as a difference signal, between the control inputs of the first and the second transistor.

8. An analog-digital converter as defined in claim 6, wherein the voltage at the second electrode of the capacitor is maintained equal to said drive voltage, and the first electrode of the capacitor, by means of the main current path of a first transistor, and the second electrode of the capacitor, by means of the main current path of a second transistor, are connected to a reference current-source circuit, the input signal being applied as a difference signal, between the reference input of the comparator and the second input of the differntial amplifier.

9. An analog-digital, converter as claimed in claim 8, wherein in that the input difference signal is applied between the control inputs of the first and the second transistor, that a constant voltage is applied both to the reference input of the comparator and to the second input of the differential amplifier, and that the voltage-current converter is constituted by a resistor which is included between the emitter of the first and of the the second transistor.

10. An analog-digital converter as claimed in claim 9, wherein the reference current source circuit comprises a first reference current source which is included in the emitter circuit of the first transistor, and a second reference current source, identical to the first source, which is included in the emitter circuit of the second transistor.

11. An analog-digital converter as claimed in claim 9, wherein the reference current source circuit is constituted by a reference current source which is included in a central tap of said resistor.

12. An analog-digital converter as claimed in claim 9, wherein said circuit comprising the first and the second transistor, the resistor and the reference current circuit is multiplied, while each of these circuits is connected to the two electrodes of the capacitor in a corresponding manner, and at option one of these individual circuits can be energized, the values of the resistor and the currents from the reference current source determining the input sensitivity.

13. An analog-digital converter as claimed in claim 8, wherein the input current of the input of the comparator equals the control input current of the first transistor and the input current of the first input of the differential amplifier equals the control input current of the second transistor.

14. An analog-digital converter as claimed in claim 11, wherein the analog-digital converter is formed on an integrated circuit.

* * * * *

UNITED STATES PATENT AND TRADEMARK OFFICE
CERTIFICATE OF CORRECTION

PATENT NO. : 4,057,796
DATED : November 8, 1977
INVENTOR(S) : ABRAHAM HOOGENDOORN ET AL It is certified that error appears in the above-identified patent and that said Letters Patent are hereby corrected as shown below:

Column 1, line 36, "earth" should be --ground-- line 40, "earthed" should be --grounded--

Column 2, line 1, "whilst" should be --while-- line 45, "analog digital" should be --analog-digital--

Column 3, line 10, "$V_{ref}$is" should be --$V_{ref}$ is-- line 59, "$V_i$may" should be --$V_i$ may--

Column 5, line 64, "$I_{ref}$may" should be --$I_{ref}$ may--

Column 6, line 7, "incrasing" should be --increasing-- line 10, "$V_d$during" should be --$V_d$ during-- line 26, "act" should be --fact--

Column 7, line 46, "$I''_{ref}$and" should be --$I''_{ref}$ and--

Claim 1, line 23, "fist" should be --first--

Claim 2, line 2, "wherein in that" should be --wherein-- line 9, "driven resistor." should be --driven in phase with the second switching

UNITED STATES PATENT OFFICE
CERTIFICATE OF CORRECTION

Patent No. 4,057,796            Dated   November 8, 1977

Inventor(s)  ABRAHAM HOOGENDOORN ET AL

It is certified that error appears in the above-identified patent and that said Letters Patent are hereby corrected as shown below:

transistor and the second transistor in phase with the first switching transistor, and that the reference current source circuit consists of a reference current course which is included in the common emitter circuit of the first and the second transistor.--

Claim 4, line 2, "characterized in that" should be --wherein-- line 3, "a noise signal or" should be deleted.

Claim 8, line 10, "differntial" should be --differential--

Claim 14, line 2, "11" should be --1--

Signed and Sealed this

Fourteenth Day of November 1978

[SEAL]

Attest:

RUTH C. MASON
Attesting Officer

DONALD W. BANNER
Commissioner of Patents and Trademarks